US008662761B2

(12) United States Patent
Yahata et al.

(10) Patent No.: US 8,662,761 B2
(45) Date of Patent: Mar. 4, 2014

(54) LASER OPTICAL SYSTEM USING OPTICAL FIBER TRANSMISSION

(75) Inventors: Tomonari Yahata, Kanagawa (JP); Yoshiaki Aida, Kanagawa (JP); Ryotaro Togashi, Hiroshima (JP); Ryosuke Sato, Kanagawa (JP); Toshio Inami, Kanagawa (JP); Hideaki Kusama, Kanagawa (JP)

(73) Assignees: Showa Optronics Co., Ltd., Tokyo (JP); The Japan Steel Works, Ltd, Tokyo (JP)

( * ) Notice: Subject to any disclaimer, the term of this patent is extended or adjusted under 35 U.S.C. 154(b) by 0 days.

(21) Appl. No.: 13/702,342

(22) PCT Filed: Apr. 27, 2012

(86) PCT No.: PCT/JP2012/002896
§ 371 (c)(1),
(2), (4) Date: Dec. 6, 2012

(87) PCT Pub. No.: WO2012/157194
PCT Pub. Date: Nov. 22, 2012

(65) Prior Publication Data
US 2013/0084046 A1    Apr. 4, 2013

(30) Foreign Application Priority Data
May 18, 2011  (JP) .................................. 2011-111396

(51) Int. Cl.
*G02B 6/36*       (2006.01)
(52) U.S. Cl.
USPC ............................................. 385/93; 385/88

(58) Field of Classification Search
USPC ............................................................. 385/93
See application file for complete search history.

(56) References Cited

U.S. PATENT DOCUMENTS

| | | | |
|---|---|---|---|
| 6,249,385 B1 | 6/2001 | Yamazaki et al. | |
| 7,519,252 B2 | 4/2009 | Morita | |
| 2010/0163537 A1* | 7/2010 | Furuta et al. ............. | 219/121.72 |

FOREIGN PATENT DOCUMENTS

| | | |
|---|---|---|
| JP | 10-153746 A | 6/1998 |
| JP | 10-244392 A | 9/1998 |
| JP | 2006-278491 A | 10/2006 |
| JP | 2007-226146 A | 10/2007 |
| JP | 2008-147428 A | 6/2008 |

\* cited by examiner

*Primary Examiner* — Uyen Chau N Le
*Assistant Examiner* — Kajli Prince
(74) *Attorney, Agent, or Firm* — Carrier Blackman & Associates, P.C.; Joseph P. Carrier; William D. Blackman

(57) ABSTRACT

A laser optical system using optical fiber transmission, includes a first optical fiber for transmitting laser light emitted from a laser oscillator, a collimator lens for collimating laser light emitted from the first optical fiber, a spherical array lens including a plurality of cells for converging laser light emitted from the collimator lens into a plurality of spots, a plurality of second optical fibers each having a smaller core diameter than the first optical fiber and configured to admit the laser light converged into the corresponding spot by the spherical array lens, the second optical fibers having output ends that have mutually parallel axial lines and are arranged linearly in a single row, and a linearization optical unit for shaping laser light emitted from the second optical fibers into laser light having a linear cross section at an illuminated surface.

7 Claims, 4 Drawing Sheets

Fig.3
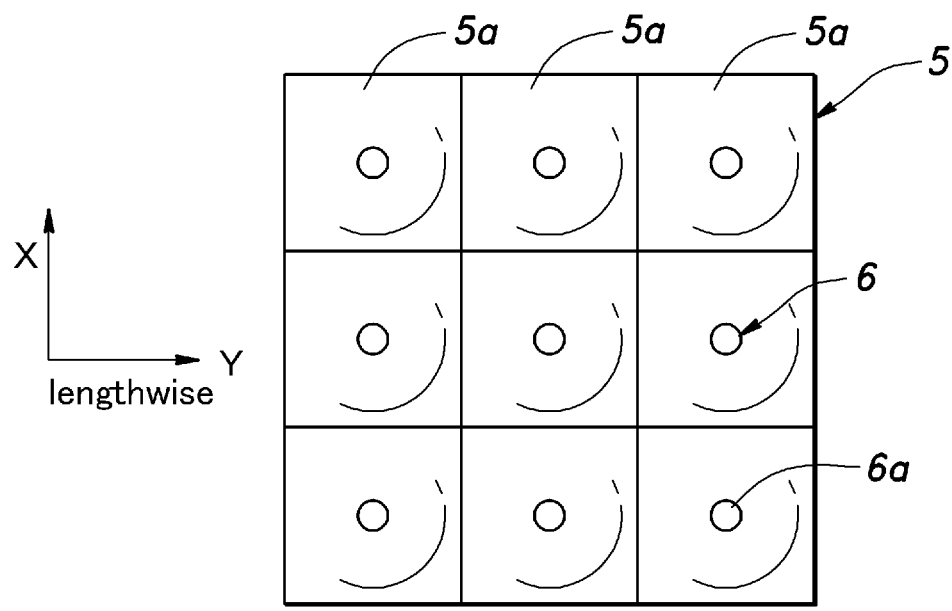
(A)
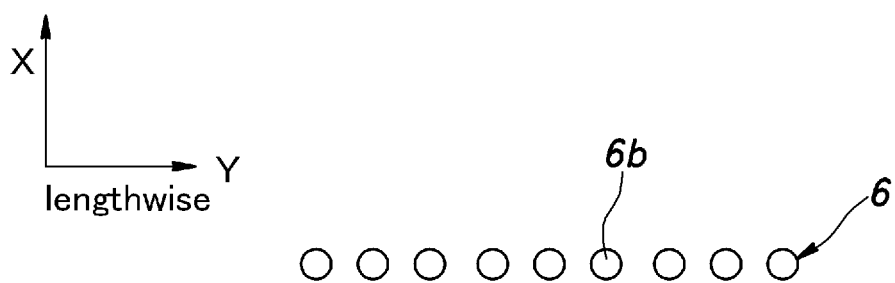
(B)

Fig.4
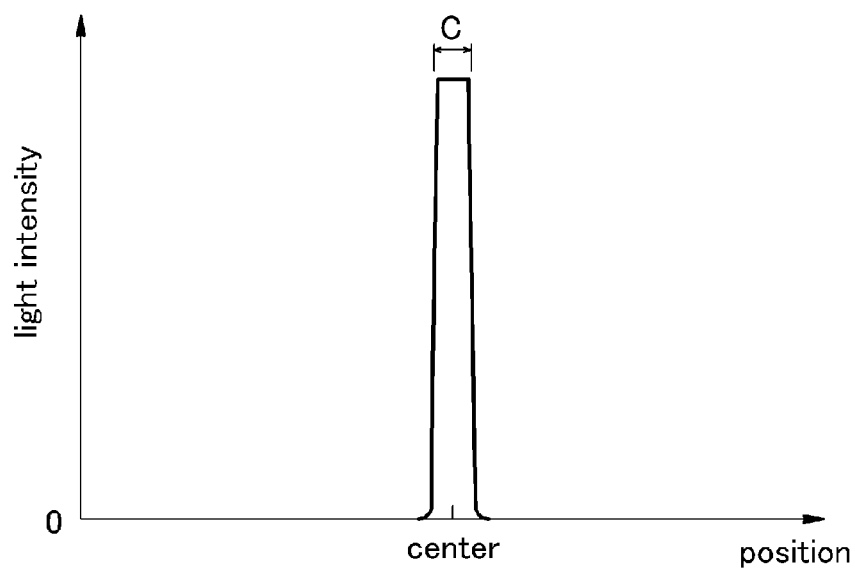
(A)
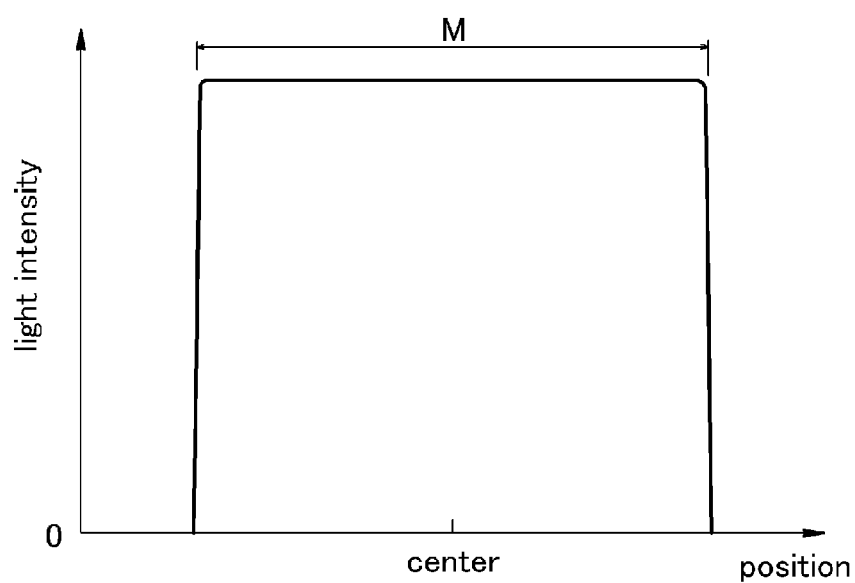
(B)

LASER OPTICAL SYSTEM USING OPTICAL FIBER TRANSMISSION

TECHNICAL FIELD

The present invention relates to a laser optical system using optical fibers for transmitting laser light generated from an oscillator and shaping the laser light into a prescribed laser beam, and in particular to a laser optical system suitable for use in annealing silicon thin film.

The laser annealing technology is known as a technology for crystallizing or otherwise modifying the surface of a work piece by using laser light. The conventional laser annealing system typically consisted of an excimer laser using a laser oscillator configured to produce a laser beam having a linear or rectangular cross section. Laser annealing systems using an excimer laser are proposed in Patent Documents 1 and 2. Such conventional systems normally used arrays of cylindrical lens arranged in a mutually perpendicular relationship to shape the laser light emitted from a laser oscillator into a laser beam having a uniform intensity distribution along a certain cross sectional direction and a highly concentrated intensity distribution along a direction perpendicular to the aforementioned cross sectional direction, or having a linear cross section.

In an optical system for shaping laser light emitted from a laser oscillator into a laser beam having a linear cross section, because the relative relationship between the light emitting position of the laser oscillator and the position at which the laser light is shaped into a laser beam having a linear cross section is fixed, the freedom in the layout, and the surface area and the volume of the system for performing the annealing or the optical exposure are severely restricted. Therefore, some of the recently introduced laser optical systems include an optical fiber fitted to a laser output end of the system to transmit the laser light by using the optical fiber. The use of the optical fiber provides a high level of freedom in the way the laser light emitted from the laser oscillator is transmitted, and can thereby eliminate the problems associated with the layout of the system.

PRIOR ART DOCUMENT(S)

Patent Document(s)

Patent Document 1: JP 10-244392
Patent Document 2: JP10-153746

SUMMARY OF THE INVENTION

Task to be Accomplished by the Invention

The performance of laser oscillators is improving progressively, and some of the laser oscillators now on the market are capable of producing extremely high outputs. When an optical fiber is connected to the output end of a high output laser oscillator, the optical fiber could be damaged. Such damage typically occurs at the input end of the optical fiber, and the risk of damage increases with an increase in the energy density of the input laser light. The density of the laser light in the optical fiber can be reduced by increasing the core diameter of the optical fiber. In other words, the energy density of the output laser light can be reduced by converging the laser light by using an optical fiber having a core diameter great enough for the given output of the laser oscillator.

On the other hand, the laser system designed for the purposes of annealing and optical exposure is desired to be able to produce laser light of a high energy density because a high energy density means a higher throughput and a lower cost for each annealed product. Therefore, it is desired to shape the cross section of the laser beam into a linear shape in addition to increasing the lengthwise dimension of the linear cross section in view of increasing the energy density of the laser beam and allowing a large surface area to be processed in a short period of time.

When an attempt is made to reduce the width of the cross section of the laser beam with the aim of increasing the throughput by means of a higher energy density, depending on the exit angle of the laser beam emitted from the optical fiber, the optical magnification factor may exceed the limit imposed by Abbe's diffraction theory, and this will result in a significant energy loss. Furthermore, the core diameter is required to be increased in order to avoid damage to the optical fiber so that the laser beam emitted from the laser oscillator could not be shaped into a linear beam with a cross section having an adequately small width.

The present invention was made with the aim of resolving such problems, and has a primary object to provide a laser optical system using optical fibers for transmitting laser light generated from an oscillator that can shape the laser light generated from the laser oscillator into a linear beam with a cross section having a small width even when the optical fibers are provided with a relative large core diameter.

Means to Accomplish the Task

To achieve such an object, the present invention provides a laser optical system (1) using optical fiber transmission, comprising: a first optical fiber (3) for transmitting laser light emitted from a laser oscillator (2); a collimator lens (4) for collimating laser light emitted from the first optical fiber; an array lens (5) including a plurality of cells for converging laser light emitted from the collimator lens into a plurality of spots; a plurality of second optical fibers (6) each having a smaller core diameter than the first optical fiber and configured to admit the laser light converged into the corresponding spot by the array lens, the second optical fibers having output ends (6b) that have mutually parallel axial lines and are arranged linearly in a single row; and a linearization optical unit (7-11) for shaping laser light emitted from the second optical fibers into laser light having a linear cross section at an illuminated surface (12).

Owing to this arrangement, the laser light emitted from the first optical fiber is converged into a plurality of spots by using the array lens, and then transmitted to the second optical fibers whose output ends are arranged in a single row so that the damage to the first optical fiber can be avoided by increasing the core diameter of the first optical fiber and a linear beam having a large lengthwise dimension as compared to the widthwise dimension can be obtained. By suitably changing the number of cells of the array lens and the number of the second optical fibers, the widthwise dimension of the linear beam can be selected at will.

According to a certain aspect of the present invention, if the first optical fiber has a core diameter of A, a widthwise NA (numerical aperture) of a condenser lens that converges the laser light onto the illuminated surface is N, and a widthwise dimension of the laser light on the illuminated surface is C, C<A is satisfied insofar as N<1.

Owing to this arrangement, N can be freely selected while the distance between the condenser lens and the illuminated surface is appropriately selected, and a linear beam that satisfies the condition that C<A can be achieved insofar as N<1.

According to another aspect of the present invention, if the first optical fiber has a core diameter of A and a NA of B, the second optical fibers have a core diameter of L and a NA of K, the laser light at the collimator lens has a beam diameter of D4 and a circle circumscribing each cell of the array lens is D5, $D4/D5=(A \times B)/(L \times K)$ holds.

Owing to this arrangement, the laser light emitted from the first optical fiber can be introduced into the second optical fibers with a minimum energy loss so that a linear beam of a high intensity (high energy density) can be obtained.

According to yet another aspect of the present invention, the linearization optical unit comprises a first cylindrical lens (7) for refracting the laser light emitted from each second optical fiber in a direction (Y-axis) along which the second optical fibers are arranged; a second cylindrical lens (8) for refracting the laser light emitted from each second optical fiber perpendicularly (X-axis) to the direction along which the second optical fibers are arranged; a cylindrical array lens (9) for refracting the laser light emitted from the first and second cylindrical lenses in the direction along which the second optical fibers are arranged; a third cylindrical lens (10) for refracting the laser light emitted from the cylindrical array lens in a direction along which the second optical fibers are arranged by using the Kohler illumination theory; and a fourth cylindrical lens (11) for refracting the laser light emitted from the cylindrical array lens perpendicularly to a direction along which the second optical fibers are arranged by using an optical image forming relationship with respect to the second cylindrical lens.

Owing to this arrangement, the laser light emitted from the second optical fibers can be shaped into a linear beam having a uniform intensity distribution on the illuminated surface both in the widthwise direction and lengthwise direction.

According to a certain aspect of the present invention, the laser optical system using optical fiber transmission can be applied to laser annealing systems. According to the present invention, an annealing process of a high throughput can be achieved by using a linear laser beam having a small widthwise dimension (having a high energy density) and a large lengthwise dimension.

Effect of the Invention

According to the present invention, the laser light emitted from the optical fibers can be shaped into a linear beam having a small widthwise dimension with a minimum energy loss.

BRIEF DESCRIPTION OF THE SEVERAL VIEWS OF DRAWINGS

FIG. 3 shows a layout of the input ends and the output ends of the optical fibers shown in FIG. 2; and FIG. 4 show graphs showing the distribution of the intensity of laser light on the illuminated surface.

DESCRIPTION OF THE EMBODIMENT(S) OF THE INVENTION

Now the present invention is described in the following in more detail in terms of a concrete embodiment with reference to the appended drawings.

Figure 1:
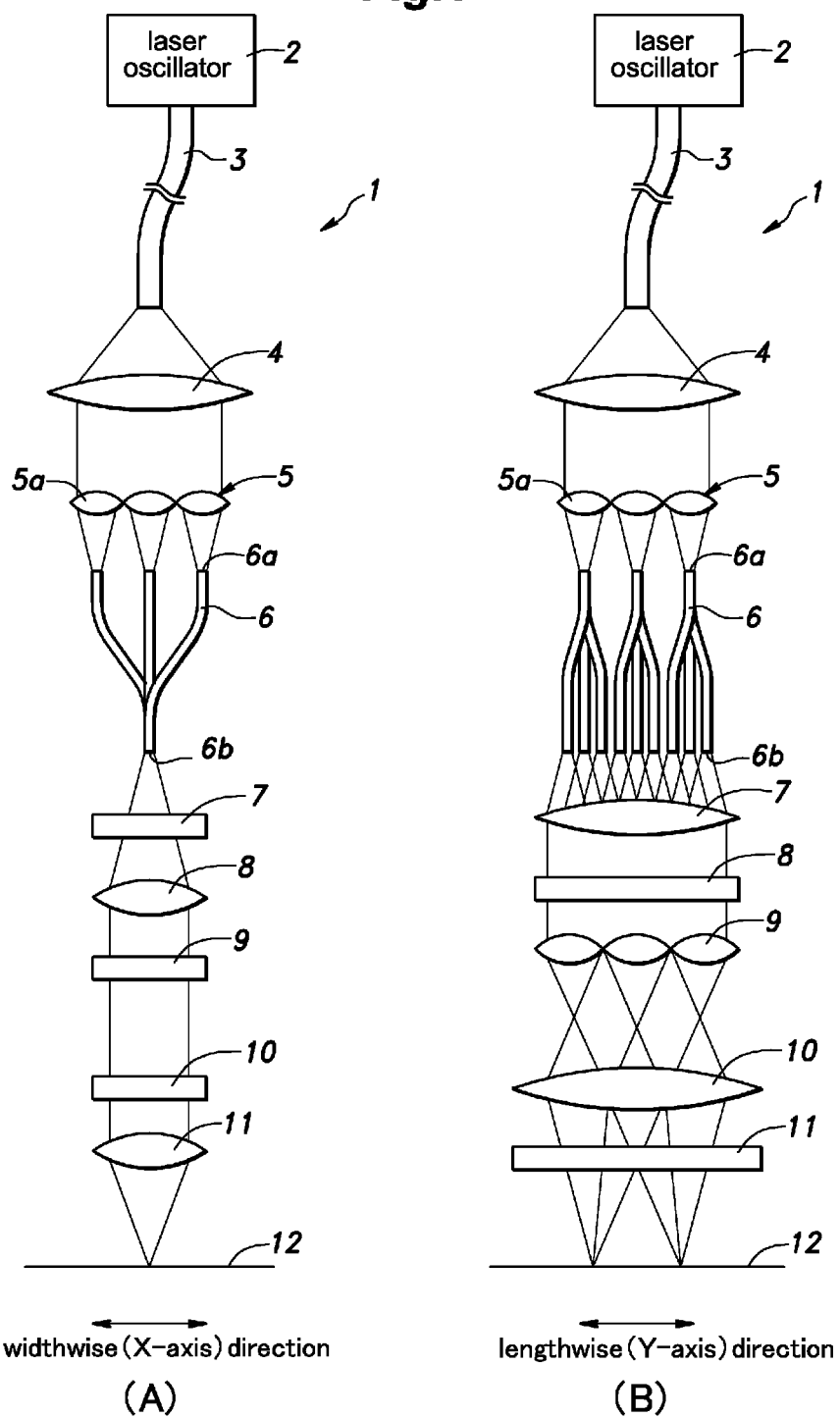
FIG. 1 is a schematic diagram of a laser optical system using optical fibers for transmitting laser light embodying the present invention.
Figure 2:
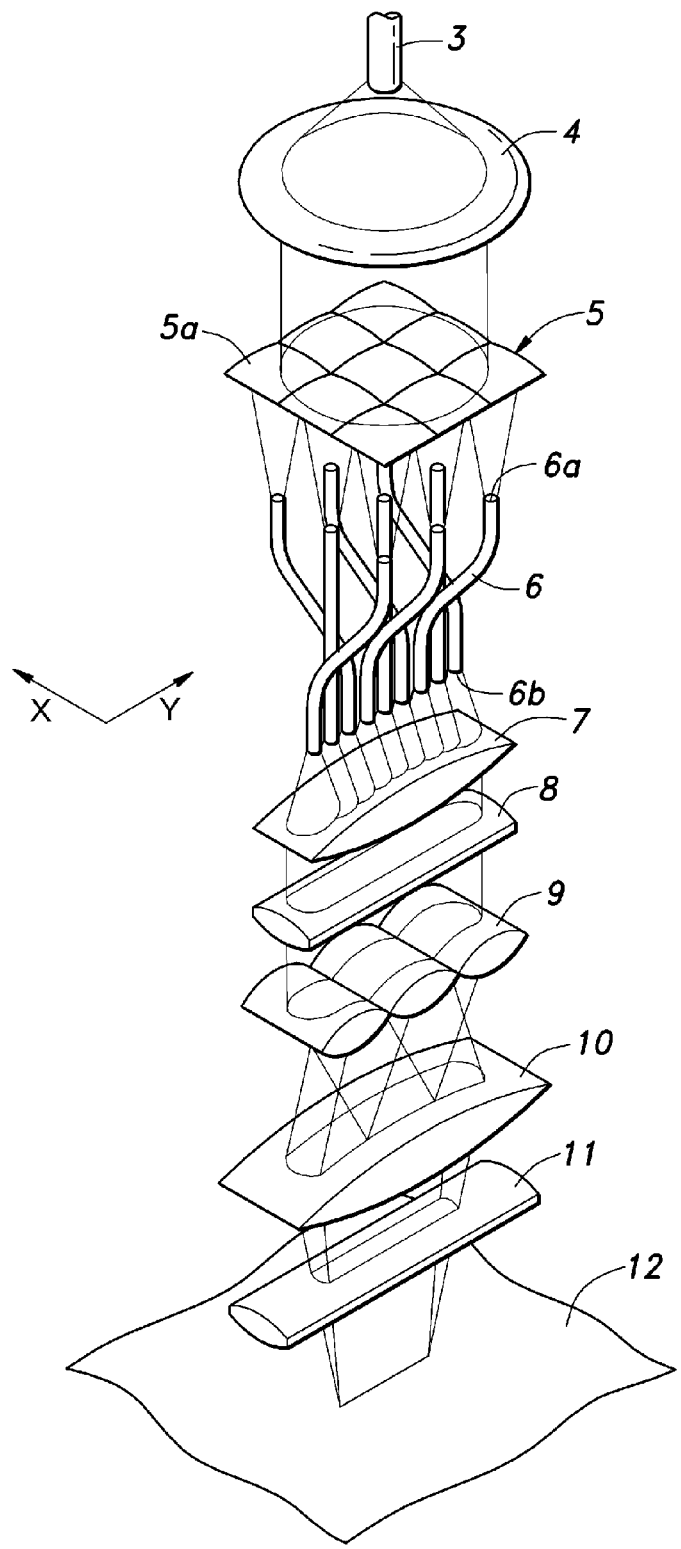
FIG. 2 is a perspective view of the laser optical system shown in FIG. 1.

FIG. 1 is a schematic diagram of a laser optical system 1 using optical fibers for transmitting laser light embodying the present invention. In particular, FIG. 1(A) shows a front view of the optical system, and FIG. 1(B) shows a side view of the optical system. As shown in FIGS. 1 and 2, the laser optical system 1 includes a laser oscillator 2 having a first optical fiber 3 connected to a laser output end thereof. The first optical fiber 3 is provided with a relatively large core diameter which is large enough to avoid damage to the first optical fiber 3 when subjected to the laser light emitted from the laser oscillator 2, and emits laser light having a prescribed divergent cone angle from an output end thereof. To the output end of the first optical fiber 3 is disposed a collimator lens 4 which transforms the laser light emitted from the first optical fiber 3 into a parallel beam.

A spherical array lens 5 is provided at the output end of the collimator lens 4. The spherical array lens 5 includes a matrix of cells 5a arranged both along an X-axis and a Y-axis which are perpendicular to each other, and each cell 5a consists of a spherical lens having a square shape in plan view. In the illustrated embodiment, the spherical array lens 5 includes nine cells 5a arranged in a three by three arrangement. The parallel laser beam that enters the spherical array lens 5 is converged into a single spot by each of the cells 5a (thereby forming nine spots in this case).

The output end of the spherical array lens 5 is connected to a number of second optical fibers 6 corresponding in number to the spots formed by the spherical array lens 5 (nine in the 3×3 arrangement of the illustrated embodiment), each second optical fiber 6 having a smaller core diameter than the first optical fiber 3. The input end 6a of each second optical fiber 6 is located at the position where the light spot is formed by the corresponding cell 5a of the spherical array lens 5 or at the focal point of the corresponding cell 5a of the spherical array lens 5 as shown in FIG. 3(A). In other words, the input ends of the second optical fibers 6 are located at the centers of the corresponding cells 5a in plan view.

The axial lines of the input ends 6a of the second optical fibers 6 are disposed in parallel with the optical axial line. Being in parallel with the optical axis as used herein means being in parallel with the axis of rotational symmetry of each cell 5a (which is referred to as the optical axial line) instead of the center of the actual light beam that passes through each cell 5a. The laser beam converged by each cell 5a enters the input end 6a of the corresponding second optical fiber 6, and is transmitted through the second optical fiber 6.

When forming a spot with each cell 5a of the spherical array lens 5, the angle of the laser beam that enters the corresponding second optical fiber 6 should not exceed the NA of the second optical fiber 6, and the diameter of the spot should not exceed the core diameter of the second optical fiber 6.

If the core diameter of the first optical fiber 3 is A, the NA of the first optical fiber 3 is B, the core diameter of the second optical fiber 6 is L and the NA of the second optical fiber 6 is K, A>L and B>K are satisfied. If the beam diameter at the collimator lens 4 is D4 and the diameter of the circle that circumscribes each cell 5a of the spherical array lens 5 is D5, then the following relationship holds.

$$D4/D5=(A \times B)/(L \times K) \qquad (1)$$

By selecting the core diameter and NA of the second optical fiber 6 in this manner, the laser light that leaves the first optical fiber 4 can be introduced into the second optical fibers 6 with a minimum energy loss.

The second optical fibers 6 curve smoothly, and the output ends 6a thereof are arranged in a single linear row extending in parallel with the Y-axis to provide a linear laser light on the illuminated surface 12 as shown in FIG. 3(B). The axial lines of the output ends 6b of the second optical fibers 6 extend in parallel to each other, and, in the illustrated embodiment, are arranged at a regular interval.

The laser light leaving each second optical fiber 6 is collimated into a parallel beam having an elliptic (or oval) cross section by a cylindrical lens 7 for collimating in the lengthwise direction (Y-axis) and a cylindrical lens 8 for collimating in the widthwise direction (X-axis).

The laser light collimated into an elliptic (oval or track-shaped) cross section by the cylindrical lens 8 is introduced into a cylindrical array lens 9 based on the Kohler illumination theory and a cylindrical lens 10 in order to achieve a uniform energy distribution along the lengthwise direction on the illuminated surface 12. The dimension M of the laser beam on the illuminated surface 12 as measured along the lengthwise direction is determined by multiplying the magnification factor determined by the focal lengths of the cylindrical array lens 9 and the cylindrical lens 10 to the cell dimension of the cylindrical array lens 9.

The laser beam collimated into the elliptic cross section is converged in the widthwise direction according to the optical image forming relationship between the cylindrical lens 8 and another cylindrical lens 11. The dimension C of the laser beam on the illuminated surface 12 as measure along the widthwise direction is determined by multiplying the magnification factor determined by the focal lengths of the cylindrical lens 8 and the cylindrical lens 11 to the core diameter of each second optical fiber 6. The dimension C of the laser beam on the illuminated surface 12 as measured along the widthwise direction is related to L and A such that $C<L<A$.

In this laser optical system 1 using optical fiber transmission, if the widthwise NA of the cylindrical lens 11 that converges the laser light onto the illuminated surface 12 with respect to the widthwise direction is N and the distance between the cylindrical lens 11 and the illuminated surface 12 is appropriately selected, by varying N insofar as $N<1$ is satisfied, the dimension C of the laser beam on the illuminating surface 12 along the widthwise direction can be selected, and the dimension C can be made smaller than A without incurring a significant energy loss.

In this laser optical system 1 using optical fiber transmission, a light intensity distribution as shown in FIG. 4 can be achieved on the illuminated surface 12. FIG. 4(A) shows the light intensity distribution of the laser light along the widthwise direction (X-axis), and FIG. 4(B) shows the light intensity distribution of the laser light along the lengthwise direction (Y-axis). As shown in FIG. 4, the laser optical system 1 using optical fiber transmission according to the present invention achieves a substantially uniform light intensity distribution along the entire dimension C of the widthwise direction and a substantially uniform light intensity distribution along the entire dimension M of the lengthwise direction on the illuminated surface 12.

The laser light emitted from the first optical fiber 3 is collimated by the collimator lens 4, and introduced into the second optical fibers 6 having a smaller core diameter via the spherical array lens 5. The output ends 6b of the second optical fibers 6 having a smaller core diameter are arranged linearly in a single row. By using the principle of the Kohler illumination with respect to the lengthwise direction (Y-axis) of the output ends 6b and using the optical image forming relationship between the two lenses with respect to the widthwise direction (X-axis) of the output ends 6b, a laser beam having a linear cross sectional shape and a uniform light intensity distribution can be achieved on the illuminated surface 12 in such a manner as was quite impossible to be achieved without using the optical components of the present invention ranging from the spherical array lens 5 to the second optical fibers 6.

The laser optical system 1 using optical fiber transmission that can radiate laser light on the illuminated surface 12 in this manner is highly suitable for use in annealing thin film silicon.

The present invention was described in terms of a specific embodiment, but the present invention is not limited by the illustrated embodiment. For instance, the spherical array lens 5 of the illustrated embodiment contained cells in a 3 by 3 arrangement, but may also be arranged in a matrix having different numbers of rows and columns. Also, each cell 5 may not be square in shape, but may also be rectangular, hexagonal or otherwise shaped. The shapes and layouts of the various components of the present invention can be modified without departing from the spirit of the present invention.

| GLOSSARY | |
|---|---|
| 1 | laser optical system using optical fiber transmission |
| 2 | laser oscillator |
| 3 | first optical fiber |
| 4 | collimator lens |
| 5 | spherical array lens |
| 6 | second optical fiber |
| 6a | input end |
| 6b | output end |
| 7 | cylindrical lens (first cylindrical lens) |
| 8 | cylindrical lens (second cylindrical lens) |
| 9 | cylindrical lens array |
| 10 | cylindrical lens (third cylindrical lens) |
| 11 | cylindrical lens (fourth cylindrical lens) |
| 12 | illuminated surface |
| A | core diameter of the first optical fiber 3 |
| B | NA of the first optical fiber 3 |
| L | core diameter of the second optical fibers 6 |
| K | NA of the second optical fibers 6 |
| N | NA of the lens for converging the laser beam onto the illuminated surface 12 along the widthwise direction |
| C | cross sectional dimension of the laser beam on the illuminated surface 12 along the widthwise direction |
| M | cross sectional dimension of the laser beam on the illuminated surface 12 along the lengthwise direction |
| D4 | beam diameter at the collimator lens 4 |
| D5 | diameter of the circle circumscribing the cells 5a of the spherical array lens 5 |

The invention claimed is:

1. A laser optical system using optical fiber transmission, comprising:
    a first optical fiber for transmitting laser light emitted from a laser oscillator;
    a collimator lens for collimating laser light emitted from the first optical fiber;
    an array lens including a plurality of cells for converging laser light emitted from the collimator lens into a plurality of spots;
    a plurality of second optical fibers each having a smaller core diameter than the first optical fiber and configured to admit the laser light converged into the corresponding spot by the array lens, the second optical fibers having output ends that have mutually parallel axial lines and are arranged linearly in a single row; and
    a linearization optical unit for shaping laser light emitted from the second optical fibers into laser light having a linear cross section at an illuminated surface.

2. The laser optical system using optical fiber transmission according to claim 1, wherein if the first optical fiber has a core diameter of A, a widthwise NA of a condenser lens that converges the laser light onto the illuminated surface is N, and a widthwise dimension of the laser light on the illuminated surface is C, $C<A$ is satisfied insofar as $N<1$.

3. The laser optical system using optical fiber transmission according to claim 1, wherein if the first optical fiber has a core diameter of A and a NA of B, the second optical fibers have a core diameter of L and a NA of K, the laser light at the collimator lens has a beam diameter of D4 and a circle circumscribing each cell of the array lens is D5, D4/D5=(A×B)/(L×K) holds.

4. The laser optical system using optical fiber transmission according to claim 1, wherein the linearization optical unit comprises
   a first cylindrical lens for refracting the laser light emitted from each second optical fiber in a direction along which the second optical fibers are arranged;
   a second cylindrical lens for refracting the laser light emitted from each second optical fiber perpendicularly to the direction along which the second optical fibers are arranged;
   a cylindrical array lens for refracting the laser light emitted from the first and second cylindrical lenses in the direction along which the second optical fibers are arranged;
   a third cylindrical lens for refracting the laser light emitted from the cylindrical array lens in a direction along which the second optical fibers are arranged by using the Kohler illumination theory; and
   a fourth cylindrical lens for refracting the laser light emitted from the cylindrical array lens perpendicularly to a direction along which the second optical fibers are arranged by using an optical image forming relationship with respect to the second cylindrical lens.

5. The laser optical system using optical fiber transmission according to claim 2, wherein if the first optical fiber has a core diameter of A and a NA of B, the second optical fibers have a core diameter of L and a NA of K, the laser light at the collimator lens has a beam diameter of D4 and a circle circumscribing each cell of the array lens is D5, D4/D5=(A×B)/(L×K) holds.

6. The laser optical system using optical fiber transmission according to claim 2, wherein the linearization optical unit comprises
   a first cylindrical lens for refracting the laser light emitted from each second optical fiber in a direction along which the second optical fibers are arranged;
   a second cylindrical lens for refracting the laser light emitted from each second optical fiber perpendicularly to the direction along which the second optical fibers are arranged;
   a cylindrical array lens for refracting the laser light emitted from the first and second cylindrical lenses in the direction along which the second optical fibers are arranged;
   a third cylindrical lens for refracting the laser light emitted from the cylindrical array lens in a direction along which the second optical fibers are arranged by using the Kohler illumination theory; and
   a fourth cylindrical lens for refracting the laser light emitted from the cylindrical array lens perpendicularly to a direction along which the second optical fibers are arranged by using an optical image forming relationship with respect to the second cylindrical lens.

7. The laser optical system using optical fiber transmission according to claim 3, wherein the linearization optical unit comprises
   a first cylindrical lens for refracting the laser light emitted from each second optical fiber in a direction along which the second optical fibers are arranged;
   a second cylindrical lens for refracting the laser light emitted from each second optical fiber perpendicularly to the direction along which the second optical fibers are arranged;
   a cylindrical array lens for refracting the laser light emitted from the first and second cylindrical lenses in the direction along which the second optical fibers are arranged;
   a third cylindrical lens for refracting the laser light emitted from the cylindrical array lens in a direction along which the second optical fibers are arranged by using the Kohler illumination theory; and
   a fourth cylindrical lens for refracting the laser light emitted from the cylindrical array lens perpendicularly to a direction along which the second optical fibers are arranged by using an optical image forming relationship with respect to the second cylindrical lens.

* * * * *